US006605543B1

(12) United States Patent
Zheng

(10) Patent No.: US 6,605,543 B1
(45) Date of Patent: Aug. 12, 2003

(54) PROCESS TO CONTROL ETCH PROFILES IN DUAL-IMPLANTED SILICON FILMS

(75) Inventor: Tammy Zheng, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/475,891

(22) Filed: Dec. 30, 1999

(51) Int. Cl.⁷ ............................................. H01L 21/302
(52) U.S. Cl. ...................... 438/710; 438/719; 438/723; 438/724
(58) Field of Search ................... 438/705, 710, 438/712, 719, 723, 724, 734, 735

(56) References Cited

U.S. PATENT DOCUMENTS

| 4,789,426 A | * | 12/1988 | Pipkin ........................ 156/643 |
| 5,336,365 A | * | 8/1994 | Goda et al. ................. 156/643 |
| 5,525,542 A | * | 6/1996 | Maniar et al. .............. 437/186 |
| 5,665,203 A | * | 9/1997 | Lee et al. ................... 438/712 |
| 5,767,018 A | * | 6/1998 | Bell ............................ 438/696 |
| 6,081,334 A | * | 6/2000 | Grimbergen et al. ....... 356/357 |

* cited by examiner

Primary Examiner—Robert Kunemund
Assistant Examiner—Duy-Vu Deo
(74) Attorney, Agent, or Firm—Peter Zawilski

(57) ABSTRACT

A process increases the etch control on the thin gate oxidation near the edges of a poly-silicon or amorphous silicon gate stack. Formation of micro-trenches, while achieving nearly vertical profiles, is substantially minimized. In a method for manufacturing a semiconductor device gate stack a breakthrough etch removes residual oxide and antireflection coating until the layer of amorphous silicon is exposed. A bulk etch removes the amorphous silicon until about 40% remains. The remaining amorphous silicon layer is etched with a high selectivity etch until oxide is exposed. Any residual poly or amorphous silicon is etched with a very high-selectivity ratio over etch until clear.

13 Claims, 3 Drawing Sheets

PROCESS TO CONTROL ETCH PROFILES IN DUAL-IMPLANTED SILICON FILMS

FIELD OF INVENTION

The present invention is generally directed to the manufacture of a semiconductor device. In particular, the present invention relates to a process that increases the etch control on the thin gate oxidation near the edges of a poly-silicon or amorphous silicon gate stack.

BACKGROUND OF INVENTION

One important stage in the manufacture of a semiconductor device involves photolithography and etching. In photolithography, a wafer substrate is coated with a light-sensitive material called photo-resist. The wafer is then exposed to a pattern of light. The pattern is created by passing the light through a mask plate prior to etch. The mask plate defines the desired features to be printed on the substrate. After exposure, the resist-coated wafer substrate is developed. The desired features as defined on the mask are retained on the photoresist-coated substrate. Unexposed areas of resist are washed away. The wafer is then subjected to etching. Depending upon the production process, the etching may either be a wet etch in which liquid chemicals are used to remove wafer material or a dry etch in which wafer material is subjected to a radio frequency (RF) induced plasma.

In many modern sub-micron processes, the gate electrode is comprised of a composite of layers of materials "stacked" on top of one another, hence the name, "gate stack." A commonly used gate stack is amorphous silicon ($\alpha$-Si) or poly silicon (poly-Si) on top of a thin gate oxide. The $\alpha$-Si or poly-Si is typically doped with N-type carriers for NMOS or with P-type carriers for PMOS to obtain asymmetry threshold voltage between N-channel and P-channel devices for a CMOS device. As IC dimensions are reduced in size, thinner gate oxide is required to maintain an acceptable level of gate capacitance.

Different doping types, doses, and activation levels of the $\alpha$-Si or poly-Si have significant effects on the $\alpha$-Si or poly-Si etch rate as well as the etch profile. N-doped $\alpha$-Si or poly-Si usually etches faster than P-doped $\alpha$-Si or poly-Si in a plasma etch process. Under the N-type material, thin gate oxide, may be exposed to the plasma and removed when etching the P-type material. A localized breakthrough, "microtrenching," of the thin gate oxidation in the bottom of the $\alpha$-Si or poly-Si etch features can result. Micro-trenches are small trenches formed in the bottom of the $\alpha$-Si features mostly adjacent to the sidewall, and the subsequent rapid etching of the underlying silicon.

With a relatively thin gate oxide, microtrenching is problematic, especially in N-doped areas. In a plasma etch process, a gate etch profile is also very sensitive to the doping of $\alpha$-Si or poly-Si. In addition, the doping profiles between N-doped and P-doped $\alpha$-Si or poly-Si may be different especially for dense $\alpha$-Si or poly-Si lines. Consequently, there may also be unacceptable critical dimension (CD) variation among gate stacks in dense and sparse areas. Such CD variation in the gate significantly affects the performance of the manufactured devices.

Accordingly, a need exists for a gate etch process that is substantially free of micro-trenching and achieves consistent etch profiles in N/P-type doped gate stacks, as well as good critical dimension control as the process technology approaches fractional microns.

SUMMARY OF INVENTION

The present invention is exemplified in a number of implementations, two of which are summarized below. During the forming of gate stack structures of a transistor, the invention minimizes microtrenching of the thin gate oxide adjacent to the silicon gate structures. Additionally, the invention provides for gate etch profiles which are nearly vertical and consistent across the wafer. In accordance with a first embodiment of the invention, a method for etching unmasked areas of a gate stack having an anti reflective coating (ARC) formed on a doped amorphous-silicon layer on a silicon oxide on a substrate, comprises first placing the substrate into an etch chamber. Then the ARC layer is etched with a breakthrough etch until the layer of amorphous silicon is exposed. Next, a bulk etch etches the amorphous-silicon layer until about 40% of the amorphous silicon remains. Following the bulk etch, the process etches the remaining amorphous-silicon layer with a high selectivity etch until the silicon oxide is exposed. The remaining amorphous-silicon layer is etched with a very high-selectivity over-etch until all of the amorphous silicon residues are cleared. An additional feature of this embodiment is that poly-silicon may be substituted for the amorphous silicon used in the silicon layer of the gate stack. Also, the ARC layer may be silicon oxy-nitride or one of a number of materials having similar properties.

The above process achieves the desired gate stack profiles by using, in part, a low bias power and a low $Cl_2$/HBr flow ratio. Desirable gate stack profiles are in the range of about 85° to 90° with respect to the substrate. The low $Cl_2$/HBr ratio enhances the etch selectivity. Undesirable removal of gate oxide is substantially minimized as the amorphous or poly silicon is etched.

In another embodiment according to the present invention, a method for selectively etching a gate stack having a silicon layer covering a thin oxide layer which covers a substrate, the silicon layer having a hard mask layer thereon comprises etching through the hard mask layer of the gate stack, with a first process gas having a fluorine-based chemistry, until the silicon layer is exposed. With a second process gas, including a mixture of HBr, $Cl_2$, and $CF_4$, the silicon layer of the gate stack is etched. Then the gate stack is etched with a third process gas including a mixture of HBr, $Cl_2$, and 80% He—$O_2$ until the thin oxide is exposed. The gate stack is over etched with a fourth process gas including a mixture of HBr, 80% He—$O_2$, and He. An additional feature of this embodiment is that silicon layer may be formed from amorhous silicon or poly silicon. Also, the hard mask layer may be silicon oxy-nitride or one of a number of materials having similar properties.

Again, desirable gate stack profiles are in the range of about 85° to 90° with respect to the substrate are attained. The undesirable removal of the gate oxide is substantially minimized during etch of the amorphous or poly silicon.

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
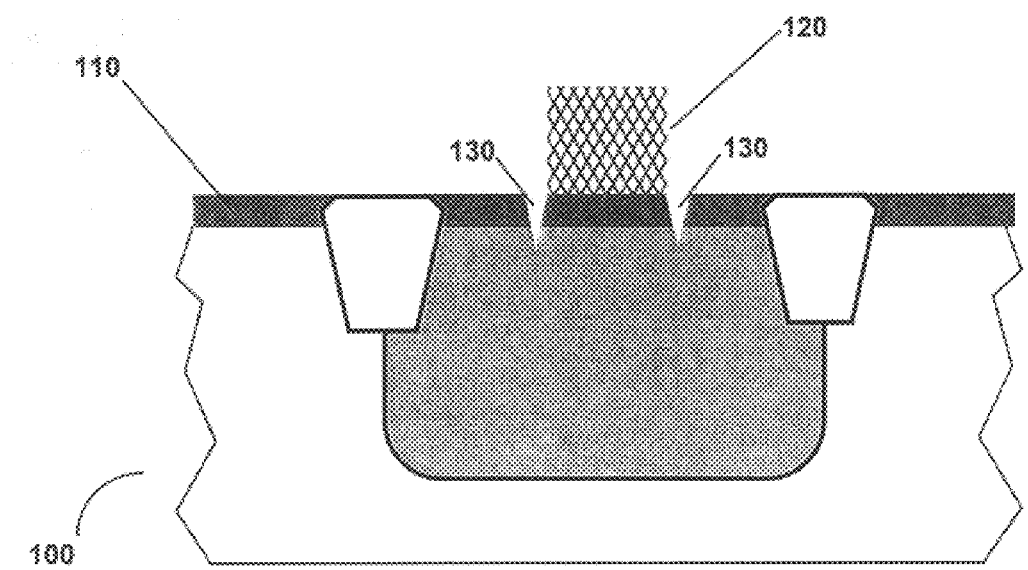
FIG. 1 illustrates according to the prior art, "microtrenching" of the thin gate oxide at the edge of the amorphous or poly-silicon gate stack of a MOS transistor after gate etch.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found to be useful and advantageous in connection with etch processes used to manufacture MOS-type transistors. The present invention has been found to be particularly useful where it is difficult to control the etch profile in a gate stack is to assure that the underlying thin oxide layer is not attacked during the etching. In the discussion that follows, a MOS structure is used to describe an example implementation of the invention. However, the invention is not necessarily limited.

In obtaining an improved etch profile of dual-implanted gate stacks without micro-trenching, the invention uses a lower bias power and an appropriate gas mixture. In certain process regimes, the etch profiles become more tapered with higher bias power due to the higher mask material sputtering rate with higher bias power. The sputtered material deposits on the sidewalls of the etched profiles and causes tapering. By lowering the bias power, the profiles may be etched more vertically. The lower bias power significantly increases the $Si:SiO_2$ selectivity. Furthermore, lowering the $Cl_2$/HBr ratio also increases the etch selectivity. With this etch, the $Si:SiO_2$ selectivity is more than 150:1. In an example process, on a 28 Å gate oxide, it is possible to obtain near 90° profiles free of micro-trenching.

FIG. 1 depicts an example NMOS transistor device 100 built with a modern sub-0.20 μm process. Due to plasma etching, a thin gate oxide region 110 exhibits microtrenching 130 near the bottom of and adjacent to an N-doped (or P-doped) α-Si or poly-Si region 120 that covers the gate of the transistor device. Since the gate oxide can be in the range of approximately 25 Å to 100 Å, microtrenching affects the characteristics of the CMOS transistor, and ultimately degrades the performance. Such degradation of performance affects yield and reliability and can result in increased processing costs.

To address the microtrenching of the thin oxide and to achieve a consist profile in an example process according to the present invention, the process begins with the implanting of N-doped (or P-doped) α-Si or poly-Si. Then a SiON ARC (Anti Reflection Coating) layer is applied on top of the α-Si or poly-Si. The gate regions are defined through conventional photo-lithographic techniques. After masking, the gate regions are etched. A first etch removes any ARC used in the masking and any native oxide present on the surface of the α-Si or poly-Si. A second etch, a bulk etch removes unwanted N-doped (or P-doped) Si with a low $Si:SiO_2$ selectivity. This etch achieving the desirable profiles, removes about 60% of the α-Si or poly-Si. Switching to a third, a very high selectivity endpoint etch, remaining α-Si or poly-Si is removed, stopping on the very thin gate oxide. A very high selectivity over etch clears out any α-Si or poly-Si residues. The process achieves the desirable, nearly vertical profile. Consequently, the effects of unacceptably varying CDs and microtrenching associated with the prior art processes are avoided.

Figure 2A:
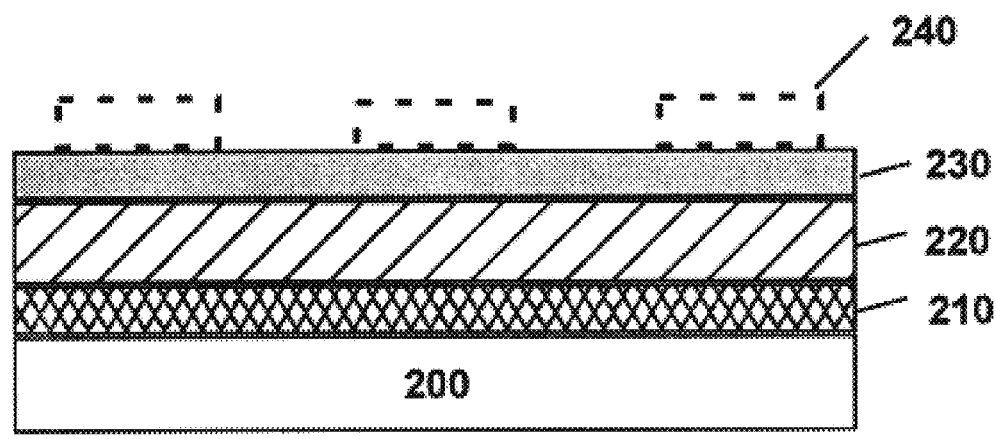
FIG. 2A is a cross-sectional view of a substrate before gate etch.
Figure 2B:
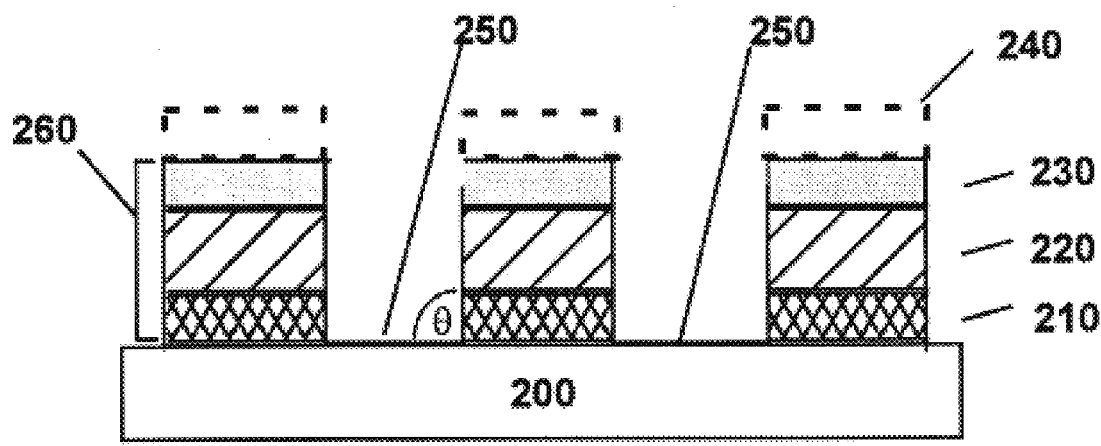
FIG. 2B is cross-sectional view of FIG. 2A after etch, according to an embodiment of the present invention.

Referring to FIGS. 2A–2B, for an oxide thickness of about 28 Å, another approach according to the present invention achieves profiles that are more anisotropic and near about 90° without microtrenching. This is possible by adjusting the bias power of the etching apparatus and adjusting the $Cl_2$/HBr ratio. Lowering the bias power and the $Cl_2$:HBr ratio increases the selectivity, from about 50:1 to above 150:1. The gate oxide etch rate is reduced significantly.

The substrate in the gate etch process, according to the present invention, first undergoes a "breakthrough" etch. A fluorine-based (e.g., $CF_4$) chemistry etches the SiON ARC (if present) and through any native oxide on the surface of the α-Si or poly-Si. Next a bulk etch with a $Cl_2$/HBr/$CF_4$ mixture etches the heavily N-doped and P-doped α-Si or poly-Si. The etch has a low $Si:SiO_2$ selectivity but provides the desired profile. At this point about 60% of the α-Si or poly-Si is removed.

Referring to FIG. 2A, in attaining the straight wall profile, the substrate 200 may be of a variety of materials suitable for semiconductor manufacture. Typically, the substrate 200 is a semiconductor wafer of silicon or gallium arsenide. Upon the substrate 200, there is a plurality of layers 260, a lower layer 210, a middle layer 220, and an upper layer 230. The layers may include oxide, nitride, and silicide layers. For example, the process according an example embodiment of the present invention may be applied to a gate structure of a MOS transistor. The lower layer 210 may be an oxide, the middle layer 220, poly-silicon, and the upper layer 230 may be an ARC layer. Photo mask 240 defines the desired pattern.

Materials suitable for the ARC layer 230 typically have low reflectivity of light for the wavelength range used to form the pattern. Therefore, the particular materials useful for forming the ARC layer 230 depend on the size of the features and the design rules. For 0.25 μm design rules, titanium nitride is a useful material for the ARC layer 230. Other suitable materials for the ARC layer 230 include, for example, silicon oxynitride, silicon nitride, silicon dioxide, and organic ARC materials. Although the ARC material may be non-conductive, it is often desirable to use a conductive ARC. Otherwise, with additional process steps, the non-conductive ARC material needs to be removed to allow connection between the gate stack structure 260 (FIG. 2B) and subsequently formed interconnects or contacts. For a salicide process, the non-conductive ARC is removed to enable formation of a refractory metal salicide on the gate. For example, titanium may be used to form the titanium silicide on the gate. Other refractory metals include cobalt, tungsten, and molybdenum.

Referring to FIG. 2B, the photo mask 240 has protected the underlying layers from etch. The middle layer 220 of poly-silicon and the lower layer 210 of oxide are etched down to the substrate 200 in the unmasked regions 250. The remaining features 260 have sidewalls that form angles in the range of about 85° to 90° with respect to the substrate 200. These features 260 are part of specific portions of the semiconductor device being built. The features have dimensions in the range of about 0.15 μm to about 2 μm. Of course, as the process technology evolves the feature sizes decrease. In addition, the features may be "dense" or closely packed on the substrate with spans among the features being about 0.3 μm to about 30 μm wide.

Figure 3:
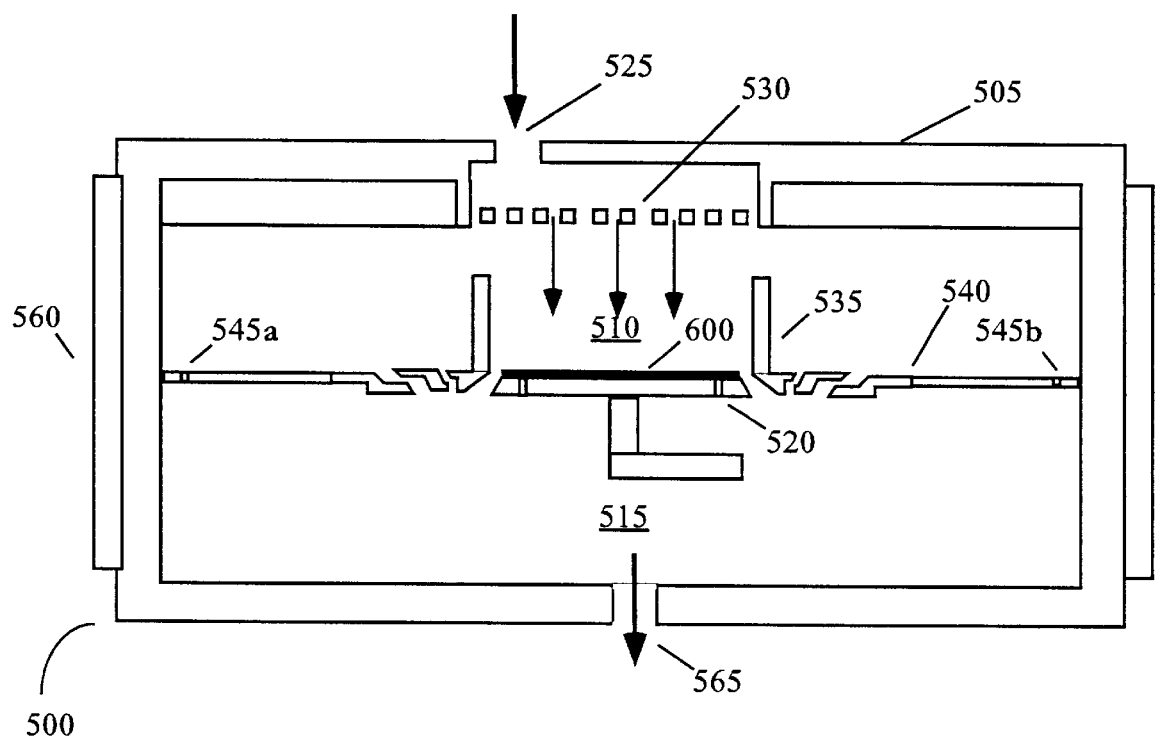
FIG. 3 is a cross-sectional view of an apparatus suitable for performing plasma etching according to the present invention.

Referring to FIG. 3, an embodiment according to the present invention is applied to an example etch apparatus. Etching of the poly-Si (α-Si) typically takes place in a plasma etch apparatus 500. The etch apparatus 500 consists of an etch chamber 505. Inside there is an etch zone 510 and a non-etch zone 515. The substrate 600 is placed on a cathode in the etch chamber 505. Through an inlet 525, a process gas is introduced into the etch chamber 505. Controls (not illustrated) upstream from the gas inlet 525 blend the constituent mixture of the process gas for a given etch chemistry. The composition of the process gas is controlled by adjusting the volumetric flow ratios of the constituent reactive gases. Volumetric flow ratio is defined as the ratio of the volume per unit time of one gas to the volume per unit time of a second gas. Typically, the flow rate of a gas is expressed as "standard cubic centimeters per minute" (sccm).

After flowing through the gas inlet 525, the process gas passes through a diffuser plate 530 which distributes the process gas in the etch zone 510. A focus ring 535 may be used to substantially contain the plasma in the etch zone 510. The plasma forms an etch gas from the process gas.

A barrier or pumping plate 540 having exhaust holes 545a and 545b separates the etch chamber 505 into an etching zone 510 and a non-etching zone 515. The exhaust holes 545a and 545b are in fluid communication with a vacuum pump through the exhaust hole 565 for withdrawing spent process gas and volatile etch-byproduct compounds from the etching chamber 505. In some apparatus, the user may activate a magnetic coil 560 to enhance the plasma formed in the etching zone 510.

In a modern example process, the configuration of the etching apparatus enables the user significant flexibility in controlling etching. A number of different configurations of plasma etch apparatus exist in the art. For example when etching the multiple layers 210, 220 and 230 of FIGS. 2A–2B, the process usually has multiple stages.

The process conditions for each stage depends upon the composition of layer that is being etched. Furthermore, when the substrate 600 is etched in multiple stages, the progress of the etch in one type of chamber, may observed by monitoring the composition of exhaust gas 565 withdrawn from the chamber. When the composition of the exhaust gas changes, it indicates that one layer has been etched through and the next layer is being etched. During the changeover, the composition of the process gases and other process parameters may be changed to provide different etch results (i.e., different etch rates, selectivity, and profiles). A number of techniques to indicate "an end of etch" are known in the art. In another type of chamber, the optical emission of the plasma, rather than the exhaust is measured to determine its composition.

In an example process according to the present invention, the volumetric flow ratio of the constituent gases, the source and bias power, and etch pressure are selected so that the sidewalls 260 of the features defined by mask layer 240 of FIG. 2B form an angle θ of at least about 85° with the substrate 200. The selectivity ratio of the process gases may be selected so that the sidewalls 260 form an angle θ in the range of about 85° to 90° with the substrate 200. Features defined at 260, having perpendicular sidewalls, are desirable for integrated circuit design and performance.

TABLE 1

Gate Etch Process

|  | Stg 01 | Breakthrough Stg 02 | Stg 03 | Bulk Stg 04 | Stg 05 | Selective Stg 06 | Stg 07 | Overetch Stg 08 | Stg 09 | Stg 10 |
|---|---|---|---|---|---|---|---|---|---|---|
| Pressure (mT) | 10.00 | 10.00 | 4.00 | 4.00 | 20.00 | 20.00 | 80.00 | 80.00 | 90.00 | 0.00 |
| RF - Top (W) | 0.0 | 350.0 | 0.0 | 200.0 | 0.0 | 150.0 | 0.0 | 250.0 | 0.0 | 0.0 |
| RF - Bottom (W) | 0.0 | 50.0 | 0.0 | 60.0 | 0.0 | 30.0 | 0.0 | 70.0 | 0.0 | 0.0 |
| Gap (cm) | 8.100 | 8.100 | 8.100 | 8.100 | 8.100 | 8.100 | 8.100 | 8.100 | 8.100 | 8.100 |
| Cl2 (sccm) | 0.0 | 0.0 | 15.0 | 15.0 | 10.0 | 10.0 | 0.0 | 0.0 | 0.0 | 0.0 |
| HBr (sccm) | 0.0 | 0.0 | 90.0 | 90.0 | 150.0 | 150.0 | 200.0 | 200.0 | 0.0 | 0.0 |
| 80% He—O2 (sccm) | 0.0 | 0.0 | 0.0 | 0.0 | 15.0 | 15.0 | 10.0 | 10.0 | 0.0 | 0.0 |
| CF4 (sccm) | 100.0 | 100.0 | 12.0 | 12.0 | 0.0 | 0.0 | 0.0 | 0.0 | 0.0 | 0.0 |
| He (sccm) | 0.0 | 0.0 | 0.0 | 0.0 | 0.0 | 0.0 | 200.0 | 200.0 | 200.0 | 0.0 |
| SF6 (sccm) | 0.0 | 0.0 | 0.0 | 0.0 | 0.0 | 0.0 | 0.0 | 0.0 | 0.0 | 0.0 |
| O2 (sccm) | 0.0 | 0.0 | 0.0 | 0.0 | 0.0 | 0.0 | 0.0 | 0.0 | 0.0 | 0.0 |
| N2 (sccm) | 0.0 | 0.0 | 0.0 | 0.0 | 0.0 | 0.0 | 0.0 | 0.0 | 0.0 | 0.0 |
| He clamp (T) | 8.0 | 8.0 | 8.0 | 8.0 | 8.0 | 8.0 | 8.0 | 8.0 | 0.0 | 0.0 |
| Completion | Stabl | Time | Stabl | Time | Stabl | EndPt | Stabl | Time | Time | End |
| Time | 30 | 24 | 30 | 50 | 30 | 150 | 30 | 60 | 7 |  |
| Channel |  |  |  |  |  | A |  |  |  |  |
| Delay (sec) |  |  |  |  |  | 55 |  |  |  |  |
| Norm (sec) |  |  |  |  |  | 2 |  |  |  |  |
| Trigger (%) |  |  |  |  |  | 99 |  |  |  |  |

|  |  |  |  |
|---|---|---|---|
|  | Bottom Electrode |  | 65.0 |
|  | Chamber |  | 60.0 |
| Pressure (mT) |  |  |  |
| RF - Top (W) | Channel |  | Wavelength (nm) |
| RF - Bottom (W) | A |  | 405 |
| Gap (cm) | B |  | 520 |
| Cl2 (sccm) |  |  |  |
| HBr (sccm) | MFC | Gas | sccm |

TABLE 1-continued

Gate Etch Process

| | | | | |
|---|---|---|---|---|
| 80% He—O2 (sccm) | 1 | Cl2 | | 200 |
| CF4 (sccm) | 2 | HBr | | 200 |
| He (sccm) | 3 | 80% He—O2 | | 20 |
| SF6 (sccm) | 4 | CF4 | | 200 |
| O2 (sccm) | 5 | He | | 200 |
| N2 (sccm) | 6 | SF6 | | 100 |
| He clamp (T) | 7 | O2 | | 100 |
| Completion | 8 | N2 | | 50 |
| Time | | | | |
| Channel | | | | |
| Delay (sec) | | | | |
| Norm (sec) | | | | |
| Trigger (%) | | | | |

Table 1 is an example process according to the present invention. The etcher used is a Lam Research, Model 9400SE. Stage 01 begins with loading wafers into an etching chamber; the control systems connected to the chamber pumps it down to vacuum conditions. The lower electrode temperatures is maintained at about 65° C. and the chamber wall temperature is maintained at about 60° C. throughout the process. Approximately 15–30 seconds are required to achieve a stable vacuum. During the stabilization step, the first process gas, $CF_4$ is introduced into the chamber at a flow rate of about 100 sccm and a pressure of about 10 mT. Mass flow controllers (MFC) enable the user to adjust the flows of the constituent process gases. The gap has been set to about 8.1 cm. The gap is the spacing between the upper and lower electrode of the plasma etcher. Going to Stage 02, the chamber powers up. The RF-top power (source power) and RF-bottom power (bias power) are about 350 watts and 50 watts, respectively. In setting the power for the etch process, the RF-top power is the source power for the plasma and it controls the plasma density. The bottom RF-bottom power is the bias power and it controls the ion energy of the plasma. For about 25 seconds, the $CF_4$-based plasma etches any SiON ARC and any native oxide on the surface of the α-Si (poly-Si). The wafers are held down on the chuck by electrostatic force. Backside helium maintained at a pressure of about 8 Torr allows for wafer temperature control.

The bulk etch of the α-Si (poly-Si) uses $Cl_2$/HBr/$CF_4$ to etch the heavily N-doped and P-doped α-Si (poly-Si) with a low Si:$SiO_2$ etch selectivity but with the 85°–90° profile. About 60% of the α-Si (poly-Si) is etched at this point. The bulk etch parameters are set in Stage 03. The chamber pressure is about 4 mT. The second process gas is a mixture of about 15 sccm of $Cl_2$, about 90 sccm of HBr, and about 12 sccm of $CF_4$. After allowing about 15–30 seconds for the pressure and gas flows to stabilize, the bulk etch at Stage 04 begins. The bulk etch runs for about 50 seconds at a RF-top power and RF-bottom power of about 200 watts and 60 watts, respectively.

The high-selectivity Si:$SiO_2$ endpoint process etches the remaining α-Si (poly-Si) and stops on the very thin gate oxide. The parameters are set at Stage 05. The chamber pressure is about 20 mT. The third process gas is a mixture of about 10 sccm of $Cl_2$, about 150 sccm of HBr, and no $CF_4$. In place of $CF_4$, 80% He—$O_2$ mixture is introduced at about 15 sccm. After about 15–30 seconds for the pressure and gas flows to stabilize, the high-selectivity etch at Stage 06 begins. The etch runs with an endpoint trigger of 99%, at a RF-top power and RF-bottom power of about 150 watts and 30 watts, respectively. In one example process, the RF-bottom power (bias power) may range from about 5 watts to about 150 watts. The RF-top (source) power may range from about 50 watts to about a 1000 watts.

The amount of power is adjusted to achieve the desired gate stack profile. Optical emission detectors shown in Table 1 as Channel A and B are used to measure and trigger the end of etch signal endpoint. In this example process, however, only Channel A is used to measure the 405 nm endpoint signal. A delay time is set to about 55 seconds. "Delay" means the time from the beginning of this step for which the endpoint signal is ignored (or after this time, starts sampling and evaluating the optical endpoint signal). "Norm" is after the delay has elapsed, the endpoint signal is sampled and then averaged to establish a normalized (100%) value. Norm specifies the duration of this sampling. The "trigger" specifies the percentage of the normalized value at which endpoint indication happens. Its value may be greater or less than 100% and triggers either on a rising or falling endpoint signal.

Following the high-selectivity endpoint process, a very high selectivity (>200:1) over etch clears up α-Si (poly-Si) residues. The parameters are set at Stage 07. The chamber pressure is about 80 mT. The fourth process gas is a mixture of about 200 sccm of HBr, and about 10 sccm of $CF_4$, and about 10 sccm of 80% He—$O_2$ mixture and about 200 sccm of He. After allowing about 30 seconds for the pressure and gas flows to stabilize, the very high-selectivity etch at Stage 08 begins. Etching takes about 60 seconds, at a RF-top power and RF-bottom power of about 250 watts and 70 watts, respectively. After the etching is completed, the chamber power is shut off and the process gases are evacuated during Stages 09–10. Wafers are unloaded from the etch apparatus for subsequent processing.

Achieved by the above process are gate profiles that are consistent across the device, nearly vertical, and substantially free of microtrenching. Consequently, the quality of the transistor structures attained is increased resulting in higher yields and lower product costs.

While the present invention has been described with reference to several particular example embodiments, those skilled in the art will recognize that many changes may be made thereto without departing from the spirit and scope of the present invention, which is set forth in the following claims.

What is claimed:

1. A method for selectively etching a gate stack having a silicon layer covering a thin oxide layer which covers a substrate, the silicon layer having an anti-reflective coating layer thereon comprising:
    etching through the anti-reflective coating layer of the gate stack, with a first process gas having a fluorine-based chemistry, until the silicon layer is exposed;

etching the silicon layer of the gate stack with a second process gas including a mixture of HBr, $Cl_2$, and $CF_4$;

etching the gate stack with a third process gas including a mixture of HBr, $Cl_2$ and 80% He—$O_2$ until the thin oxide is exposed; and over etching the gate stack with a fourth process gas including a mixture of HBr, 80% He—$O_2$ and He.

2. The method of claim 1 wherein the silicon layer is selected from the group including poly-silicon and amorphous silicon.

3. The method of claim 2 wherein the silicon layer is doped with carriers selected from the group including N-type and P-type.

4. The method of claim 1, wherein the second process gas mixture of HBr, $Cl_2$, and $CF_4$ has gas flow ratios of about (80–100):(13–17):(11–13) HBr:$Cl_2$:$CF_4$.

5. The method of claim 1, wherein the third process gas mixture of HBr,$Cl_2$ and 80% He—$O_2$ has gas flow ratios of about (135–165):(8–11):(13–17) HBr:$Cl_2$: 80% He—$O_2$ until the thin oxide is exposed.

6. The method of claim 1, wherein the fourth process gas mixture of HBr, 80% He—$O_2$ and: He, has gas flow ratios of about (180–220):(8–12):(180–200) HBr: 80% He—$O_2$:He.

7. The method of claim 1, wherein the second process gas mixture of HBr, $Cl_2$, and $CF_4$ has gas flow ratios of about (80–100):(13–17):(11–13) HBr:$Cl_2$:$CF_4$;

wherein the third process gas mixture of HBr,$Cl_2$ and 80% He—$O_2$ has gas flow ratios of about (135–165):(8–11):(13–17) HBr:$Cl_2$: 80% He—$O_2$; and wherein the fourth process gas mixture of HBr, 80% He—$O_2$ and: He, has gas flow ratios of about (180–220):(8–12):(180–200) HBr: 80% He—$O_2$:He.

8. The method of claim 1 wherein the first process gas is selected from the group including $CF_4$, $NF_3$ and $SF_6$.

9. The method of claim 1 wherein the first process gas has a flow rate in the range of about 80 to 120 sccm.

10. The method of claim 1 wherein the third process gas has a silicon-to-gate oxide selectivity ratio of at least 140:1.

11. The method of claim 1 wherein the gate stack is etched to a profile in the range of about 85° to 90°.

12. A method for etching unmasked areas of a gate stack having an anti reflective coating layer formed on a doped silicon layer on a silicon oxide on a substrate, comprising:

placing the substrate into an etch chamber;

etching the anti reflective coating layer with a breakthrough etch until the silicon layer is exposed;

etching the silicon layer with a bulk etch until about 40% of the silicon layer remains;

etching the remaining silicon layer with a high-selectivity etch including $Cl_2$, HBr, and 80% He—$O_2$ introduced into the etch chamber at flow rates in ranges of about 8–12 sccm, 120–180 sccm, and 12–18 sccm, respectively until the silicon oxide is exposed; and over-etching the remaining silicon layer with a very high-selectivity etch until silicon residues are cleared.

13. A method for etching unmasked areas of a gate stack having an anti reflective coating layer formed on a doped silicon layer on a silicon oxide on a substrate, comprising:

placing the substrate into an etch chamber;

etching the anti reflective coating layer with a breakthrough etch including $CF_4$ introduced into, the etch chamber at a flow rate in the range of about 80 sccm to 120 sccm until the silicon layer is exposed;

etching the silicon layer with a bulk etch including $Cl_2$, HBr, and $CF_4$ introduced into the etch chamber at flow rates in ranges of about 12–18 sccm, 70–110 sccm, and 9–15 sccm, respectively until about 40% of the silicon layer remains;

etching the remaining silicon layer with a high-selectivity etch including $Cl_2$, HBr, and 80% He—$O_2$ introduced into the etch chamber at flow rates in ranges of about 8–12 sccm, 120–180 sccm, and 12–18 sccm, respectively until the silicon oxide is exposed; and over-etching the remaining silicon layer with a very high-selectivity etch including HBr, and 80% He—$O_2$, and He introduced into the etch chamber at flow rates in ranges of about 160–240 sccm, 8–12 sccm, and 160–240 sccm, respectively until silicon residues are cleared.

* * * * *